United States Patent [19]

Taylor et al.

[11] Patent Number: 5,112,763
[45] Date of Patent: May 12, 1992

[54] PROCESS FOR FORMING A SCHOTTKY BARRIER GATE

[75] Inventors: Thomas W. Taylor; Donald C. D'Avanzo, both of Santa Rosa, Calif.

[73] Assignee: Hewlett-Packard Company, Palo Alto, Calif.

[21] Appl. No.: 583,926

[22] Filed: Sep. 17, 1990

Related U.S. Application Data

[63] Continuation in-part of, Ser. No. 265,615, Nov. 1, 1988, abandoned.

[51] Int. Cl.$^5$ .......................................... H01L 21/265
[52] U.S. Cl. .................................... 437/39; 437/41; 437/176; 437/179; 437/184; 148/DIG. 105; 148/DIG. 100; 148/DIG. 140
[58] Field of Search .................... 437/39, 41, 175, 176, 437/177, 179, 912, 184; 148/DIG. 100, DIG. 139, DIG. 140, DIG. 105

[56] References Cited

U.S. PATENT DOCUMENTS

| | | | |
|---|---|---|---|
| 4,517,730 | 5/1985 | Meignant | 357/15 |
| 4,525,919 | 7/1985 | Fabian | 437/176 |
| 4,546,066 | 10/1985 | Field et al. | 430/314 |
| 4,551,905 | 11/1985 | Chao et al. | 437/176 |
| 4,599,790 | 7/1986 | Kim et al. | 148/DIG. 143 |
| 4,618,510 | 10/1986 | Tan | 437/912 |

OTHER PUBLICATIONS

Hu et al., "Metal-on-Polymer Masks for Ion Beam Processing", 10th International Conf. on Electron and Ion Beam Science and Technology, Montreal Canada May 1982.

Primary Examiner—Brian E. Hearn
Assistant Examiner—Tuan Nguyen
Attorney, Agent, or Firm—William C. Milks, III

[57] ABSTRACT

Provided is a process for precisely forming a Schottky barrier gate on GaAs. In the process, a layer of polyimide is spun onto a doped GaAs substrate having a passivating layer thereon. A resist layer is then spun onto the polyimide, and either deep ultraviolet lithography in conjunction with a clear field mask, or direct electron beam exposure, is used to define a gate region. After exposure, the resist is developed, leaving the unexposed portion of the resist in place on the polyimide layer. A metal transfer layer is then deposited over the structure, and the remaining resist is dissolved leaving a hole in the metal transfer layer. The polyimide and the passivating layer are etched down to the surface of the substrate through the passivating layer. The substrate is then dry etched, and then wet chemical etched to form a recess for the Schottky gate. The Schottky gate metal is deposited onto the surface of the structure and through the hole onto the substrate. The polyimide is dissolved and the upper layers lifted off leaving the Schottky metal gate deposited in the exposed recess in the GaAs substrate.

30 Claims, 3 Drawing Sheets

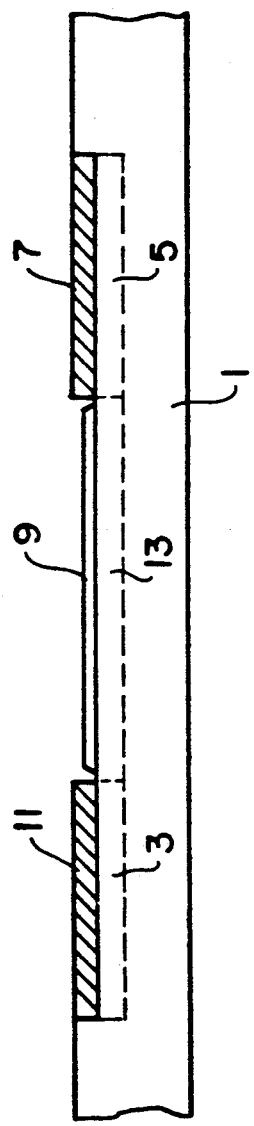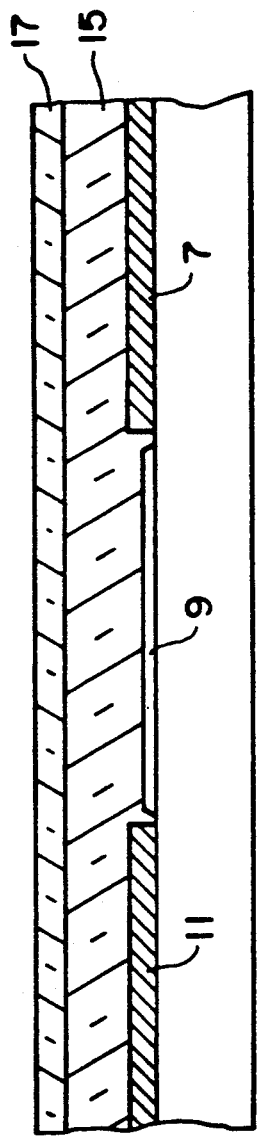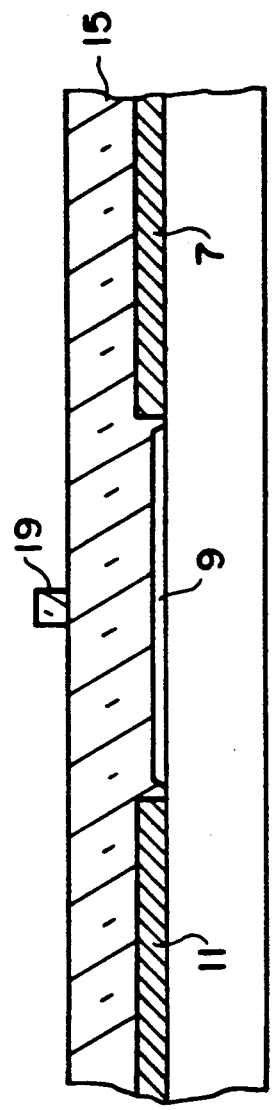

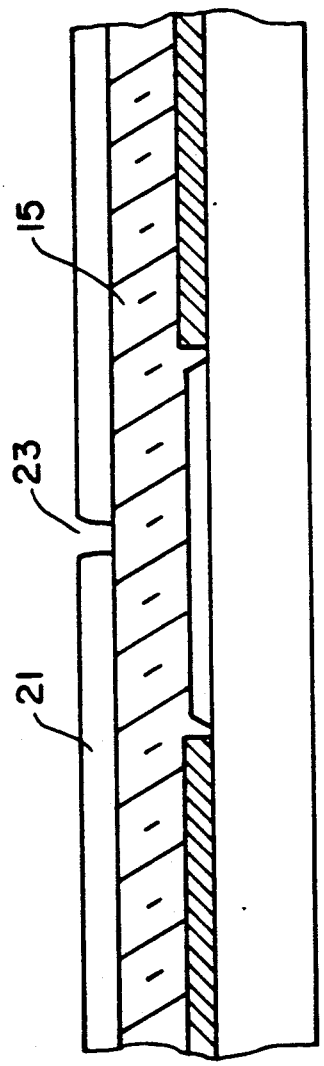
FIG_4
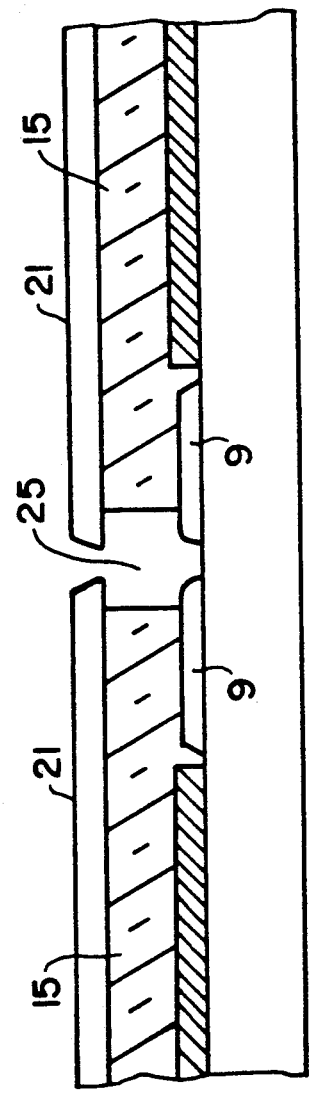
FIG_5

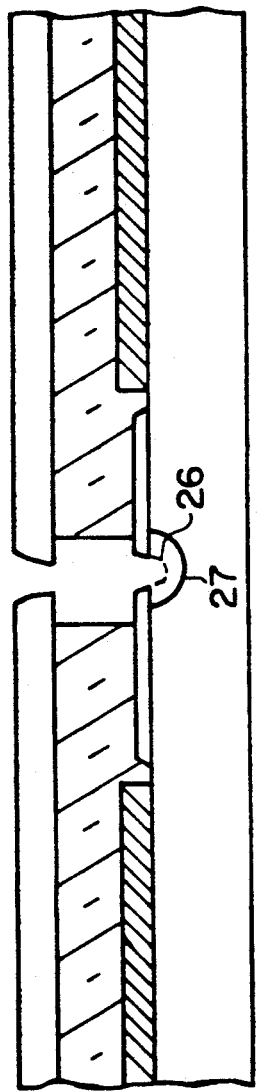
FIG._6
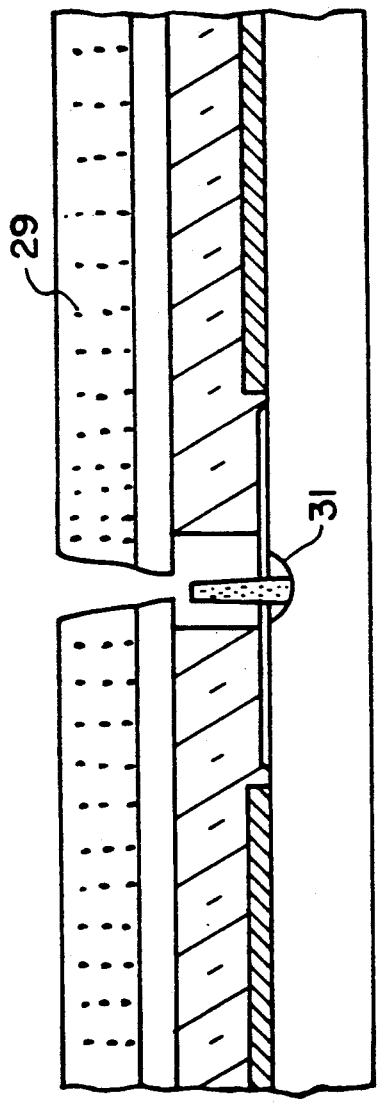
FIG._7
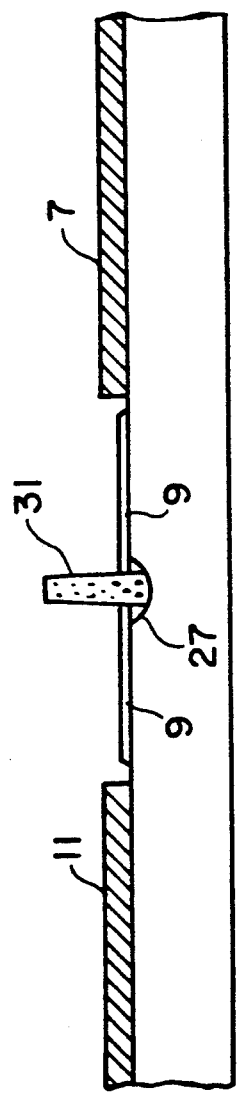
FIG._8

PROCESS FOR FORMING A SCHOTTKY BARRIER GATE

CROSS-REFERENCE TO RELATED APPLICATION

This patent application is a continuation-in-part of U.S. patent application Ser. No. 07/265,615, filed on Nov. 1, 1988, in the names of Thomas W. Taylor and Donald C. D'Avanzo, entitled "A PROCESS FOR FORMING A SCHOTTKY BARRIER GATE ON GALLIUM-ARSENIDE," and assigned to the same assignee as this application, now abandoned.

BACKGROUND OF THE INVENTION

This invention relates to a process for forming a Schottky barrier gate on a Gallium-Arsenide (GaAs) substrate and more particularly to a method for forming such a gate using a lift-off process in conjunction with a clear field mask and metal transfer layer.

GaAs is widely used in digital and analog integrated circuits and particularly in metal-semiconductor field effect transistors (MESFET). In forming a MESFET, the metal Schottky barrier gate, typically less than a micron in length and up to a few hundred microns in width, must be precisely deposited to achieve the speed desired. The present invention focuses on a novel lithographic lift-off, etching, and metal deposition process which precisely forms the Schottky barrier gate.

Considered in more detail, a concise description of the fabrication of a MESFET may be found in "GaAs Digital IC Processing—A Manufacturing Perspective", by A. Rode and J. Roper, Solid State Technology, February, 1985, pp. 209–215. Another article in the same issue, "Manufacturing Technology for GaAs Monolithic Microwave Integrated Circuits", pp. 199–205, by T. Andrade, also provides background information related to known processing techniques.

In a typical known method for producing a digital integrated circuit such as a MESFET, a GaAs substrate is appropriately doped to form an active layer and source and drain regions. The substrate is then capped with an insulator, e.g. $SiO_2$, and annealed to activate the doped layers electrically. The insulator is then removed, and the substrate is coated with a passivating dielectric material, e.g. such as silicon nitride, which can also be used as a lift-off agent for subsequent metallizations. Contact regions are then formed on the source and drain regions using a lift-off process, and the contact regions are annealed to form ohmic contacts. Gate metallization is then performed, which can also be performed with a masking and lift-off process, and the gate metal is recessed into the GaAs to provide appropriate threshold or pinchoff voltages. A first level metallization is then performed, followed by a second level metallization, such as an airbridge, to provide electrical connection between lines with a minimum of parasitic capacitance.

Numerous lift-off processes have been used in the past for IC processing, such as that described by P. Grabbe, et al., in "Tri-Level Lift-Off Process for Refractory Metals" in the Journal of Vacuum Science & Technology, May–June, 1982, pp. 33–34. Another approach is described by A. Milgram, in "Lift-Off Process for Achieving Fine-Line Metallization", published in the Journal of Vacuum Science & Technology, Apr.–Jun., 1983, pp. 490–493. Background information is also provided by E. L. Hu, et al., in "METAL-ON-POLYMER MASKS FOR ION BEAM PROCESSING", a paper presented at the Tenth International Conference on Electron and Ion Beam Science & Technology, held in Montreal, Canada in May, 1982.

SUMMARY OF THE INVENTION

In accordance with preferred embodiments of the invention, an optical lithographic patterned, tri-level lift-off process is provided that can be used in the fabrication of metal Schottky barrier gates for GaAs metal-semiconductor field effect transistors (MESFET), or modulation doped field effect transistors (MODFET).

First a doped GaAs substrate is obtained, or a GaAs substrate is doped to create an n-type active layer. Source and drain regions are appropriately doped, and metal contacts are alloyed to the source and drain regions. The active area between the source and drain regions is passivated with a dielectric, such as $SiO_2$, and a polyimide layer is spun onto the surface of the wafer. A poly-methyl-methacrylate (PMMA) photoresist layer is then spun on.

The resist layer is exposed using deep ultraviolet (DUV) and a clear field mask, or direct write electron beam lithography, so that the area over the location where the Schottky gate is to be formed is not exposed to electromagnetic radiation. The resist is developed, and the unexposed resist remains on the polyimide layer.

A metal transfer layer is then deposited on the surface of the wafer. The remaining resist is dissolved and lifted off, leaving a hole in the metal transfer layer which defines the location for the gate. The remaining metal layer is then used as a stencil for reactive ion etching of the layers therebelow.

The polyimide and $SiO_2$ layers are etched by reactive ion etching until the GaAs surface is reached. Then a dry etching of the GaAs substrate is performed, using ion beam etching, which is followed by a wet chemical etch to achieve a gate recess having the desired depth.

A Schottky metal layer is then deposited on the surface of the wafer and through the hole in the metal transfer layer. The polyimide is dissolved and the metal transfer layer is lifted off leaving a precisely formed Schottky gate in the recess in the GaAs substrate.

The novel combination of using a clear field mask to define the gate in conjunction with a metal-on-polymer mask for the reactive ion etching, or direct electron beam exposure, provides far superior gate definition than has heretofore been achieved with optical lithographic processing. Gates produced according to the method of the invention can be made to have very high aspect ratios, greater than 2 to 1.

BRIEF DESCRIPTION OF THE DRAWINGS

FIG. 1 shows a GaAs substrate with source and drain.

FIG. 2 shows the substrate with a polyimide layer and resist layer thereon.

FIG. 3 shows the substrate structure after exposure and development using a clear field mask according to the invention.

FIG. 4 shows the structure after a metal transfer layer has been deposited and the resist dissolved.

FIG. 5 shows the structure after etching down to the substrate.

FIG. 6 shows the structure after etching into the substrate.

FIG. 7 shows the structure after deposition of a Schottky metal layer.

FIG. 8 shows the structure after completion of a lift-off process, leaving a well-defined gate.

DETAILED DESCRIPTION OF THE PREFERRED EMBODIMENTS

In the following description of the exemplary embodiment, the process of the invention will be applied to the fabrication of a metal Schottky barrier gate in a MESFET. However, those skilled in the art will recognize that the process can be applied to any GaAs device using Schottky gates.

Shown in FIG. 1 is an initial wafer structure having a substrate 1 of semi-insulating GaAs. If the substrate is not already doped, the structure is first doped to create an n-type active layer 13. The structure also includes a source region 3 and a drain region 5. The doping level is conventional and is typically between $2 \times 10^{17}/cm^2$ and $3 \times 10^{17}/cm^2$. Ohmic contacts 7 and 11 are alloyed to the source and drain regions, and the active area between the source and drain ohmic contacts is passivated with a 2000 A thick layer 9 of $SiO_2$ using chemical vapor deposition. Other passivating materials can of course be used, e.g. SiN. To prepare the wafer for further processing, it is then cleaned to remove particulates with a combination wafer scrub and isopropanol boil for 10 minutes.

Next, a polyimide layer 15, such as Probimide 285 available from Ciba Geigy Corp., is spun onto the wafer at about 6000 RPM for 30 seconds. (See FIG. 2.) The spun-on surface is heated with an infrared heat lamp throughout the spin to improve the surface quality of the polyimide. The polyimide layer 15 is cured in a programmable hot plate oven that is preset to an initial temperature of 100° C. After 30 minutes at 100° C., the temperature is increased to 180° C. for 15 minutes. Then the temperature is increased again, this time to 240° C. for 15 minutes. Following the curing, the wafer is cooled and removed from the oven. A poly-methyl-methacrylate (PMMA) resist layer 17 (e.g. a 6% solution, 496K mol. wt. available from KTI Chemicals) is then spun onto the wafer at about 4000 RPM for 30 seconds. The PMMA layer 17 is cured for 60 minutes in a preset 170° C. hot plate oven. The wafers are allowed to cool and are removed from the oven.

As illustrated in FIG. 3, the wafer is then exposed using DUV optical lithography and a clear field quartz mask, or direct write E-Beam lithography, to define the gate region on the surface of the wafer. Then, the exposed PMMA is developed in a solution of methyl isobutyl ketone and isopropyl alcohol using a 1:1 molar ratio. The unexposed PMMA 19 remains on the polyimide 15.

With the DUV approach, the opaque portions of the mask correspond to the gate areas. This enables line widths to be obtained which are equal to or less than the line widths on the mask, and is quite unlike the industry standard which typically uses dark field masks, i.e. where the transparent areas correspond to the gate areas. Because of diffusion within the resist and scattering of the radiation, when using a dark field mask, the gate area exposed on the resist is larger than the area on the mask. Thus, creating narrower gates using a dark field mask requires defining even finer line widths on the mask, and is far more expensive than using a clear field mask to achieve narrower gates.

In the next step, described with reference to FIG. 4, a metal transfer layer 21 is vacuum evaporated onto the surface of the wafer, and the remaining exposed PMMA resist is dissolved by soaking the wafer in Acetone. This leaves a hole 23 in the metal transfer layer 21 at the desired gate location, so that the transfer layer acts as a stencil for a later process of reactive ion etching, since the metal acts as an ion stop and is not etched by reactive ion etching. The use of a metal lift-off layer is a substantial improvement over prior art processes that use dielectric transfer layers, since the latter do not maintain critical gate dimensions because they are etched by reactive ion etching. In the preferred mode, the metal layer 21 is itself composed of three layers, preferably aluminum, gold, and titanium, thus providing a transfer layer. The aluminum base layer, being relatively soft, provides a stress relief layer between the polyimide layer and the upper layers of the metal transfer layer. The second layer, gold, provides the high stopping power desired for the reactive ion etch. The use of titanium for the uppermost layer substantially prevents any sputtering of metal during subsequent reactive ion etching.

The polyimide layer 15 is then etched down to the $SiO_2$ layer as illustrated in FIG. 5, using a reactive ion etching system with an oxygen plasma. As an example, the etching can be conducted in a reactive ion etching system with a 10 inch (25.4 cm) cathode, using a power density of 0.4 $W/cm^2$, a gas flow rate of 40 standard cubic cm per minute (SCCM), and a total pressure of 15 mtorr, for 30 minutes. The etch time includes a two hundred percent over-etch to obtain an undercut profile 25 to facilitate proper lift-off of the metal transfer layer.

Once the etching of the polyimide layer is completed, the $SiO_2$ layer 9 is then etched, for example in the same reactive ion etching system using, however, a $CF_4$ plasma. With that system, the etching is conducted with a power density of 2.0 $W/cm^2$, a 40 SCCM gas flow rate, and 15 mtorr total pressure, for a total time of 5 minutes. The etch time is based on the oxide etch rate plus a 15% over-etch into the GaAs substrate to ensure that the $SiO_2$ is completely etched through. This over-etch or recess into the channel between source and drain causes a lowering of current passing from source to drain. Thus it is easily determined when over-etching is achieved.

In the next sequence of steps, described with reference to FIG. 6, ion beam etching is used to create a recess 26 in the GaAs surface to a depth of about 250-500 A. This etching step improves the response time for GaAs digital circuits. In the preferred mode, this etching step is conducted using a 300 volt accelerating potential, a 0.30 $mA/cm^2$ current density, and a total pressure of 3 mtorr of argon. Use of such a dry etch to achieve this initial recess is believed to improve the lag effect in GaAs digital circuits and is quite unlike the prior art which typically uses a wet chemical etch for such recesses.

Next, a wet chemical etch is used to increase the total depth of the recess to about 2000 A ±200 A below the GaAs surface, as illustrated by the arc 27. In the preferred mode, this wet etch uses a mixture of $NH_4OH$, $H_2O_2$, and $H_2O$ with approximate ratios of 7:3.5:990 by volume, respectively. This wet etch is then followed by a brief GaAs oxide etch to prepare the GaAs recess for the Schottky metal deposition. This oxide etch uses a mixture of $NH_4OH$ and $H_2O$ with approximate ratios of 1:5 by volume respectively.

In the next sequence of steps, illustrated with reference to FIG. 7, a composite Schottky metal layer 29 is deposited using an electron-gun evaporator, which simultaneously creates a gate 31 in the bottom of the recess 25. In the preferred mode, the gate 31 is composed of three layers: 1000 A of titanium as the base, 1000 A of platinum as a barrier metal between the upper and lower layers, and 6000 A of gold as the top layer.

FIG. 8 shows the resulting structure after lift-off. The lift-off is achieved by dissolving the polyimide in a hot n-methyl-2-pyrolidone bath. The result is a high aspect ratio (greater than 2 to 1) Schottky barrier gate 31, with gate length easily under 0.5 microns, thereby minimizing gate-to-channel capacitance, and minimizing carrier transport time under the gate.

Those skilled in the art will appreciate that there are many variations of the above process which can be used to achieve the desired gate geometry. For example, different systems for reactive ion etching can be used, and different combinations of chemicals may be used for the wet etching procedures. Similarly, the process can be used to produce gates in GaAs devices other than MESFETS. as noted earlier.

Also, the above process can be performed on other than a GaAs substrate, such as a silicon (Si) substrate or other semiconductor material. Other variations will also be apparent to those skilled in the art. Hence, the breadth of the invention is to be interpreted with respect to the appended claims and is not to be construed as restricted solely to the particular embodiment chosen to describe it.

We claim:

1. A process for fabricating a Schottky barrier gate on a substrate, comprising the steps of:
   depositing a lift-off agent on the substrate;
   depositing a layer of photoresist on the lift-off agent;
   exposing the photoresist layer using a clear field mask, such that an opaque portion of the mask corresponds to a Schottky barrier gate region;
   developing the photoresist, leaving unexposed photoresist adherent to the lift-off agent only on those surface areas of the lift-off agent not exposed by the mask;
   depositing a metal transfer layer on the surface of the lift-off agent;
   removing the unexposed photoresist to provide a hole through the metal transfer layer for defining a Schottky barrier gate region;
   etching through the lift-off agent to provide a hole in the lift-off agent aligned with the hole in the metal transfer layer;
   etching into the substrate surface through the hole in the metal transfer layer and the hole in the lift-off agent;
   depositing a Schottky metal layer over the metal transfer layer and through the hole therein onto the substrate to create a Schottky barrier gate on the substrate; and
   dissolving the lift-off agent and lifting off the metal transfer layer to form the Schottky barrier gate.

2. The process of claim 1 wherein the step of depositing the metal transfer layer comprises:
   depositing three separate metal layers, one above the other, over the lift-off agent, the layer adjacent the lift-off agent being a stress relief layer, the layer above and adjacent the stress relief layer being a stopping layer constructed of a high Z material for stopping ions in a reactive ion etch, and the layer above and adjacent the stopping layer being an anti-sputtering layer for preventing sputtering of said metal transfer layer during reactive ion sputtering.

3. The process of claim 2 wherein the step of depositing the three separate metal layers comprises:
   depositing a layer of aluminum onto the lift-off agent as the stress relief layer;
   depositing a layer of gold onto the aluminum layer as the stopping layer; and
   depositing a layer of titanium onto the gold layer as the stopping layer.

4. The process of claim 3 wherein the step of etching into the substrate surface comprises:
   reactive ion etching through the lift-off agent down to the substrate.

5. The process of claim 4 wherein the step of etching into the substrate surface further comprises:
   ion-beam etching the substrate after the reactive ion etching.

6. The process of claim 5 wherein the step of etching into the substrate surface further comprises:
   wet chemical etching the substrate after the ion-beam etching.

7. The process of claim 6 wherein the step of ion-beam etching is continued until a recess of about 250-500 A is created in the substrate.

8. The process of claim 7 wherein the step of wet chemical etching is continued until a recess of about 1000-2000 A is created in the substrate.

9. The process of claim 1 wherein depositing said lift-off agent is performed by spin application.

10. The process of claim 1 wherein depositing said photoresist layer is performed by spin application.

11. The process of claim 1 wherein the step of etching into the substrate surface comprises:
   reactive ion etching through the lift-off agent down to the substrate.

12. The process of claim 11 wherein the step of etching into the substrate surface further comprises:
   ion-beam etching the substrate after the reactive ion etching.

13. The process of claim 12 wherein the step of etching into the substrate surface further comprises:
   wet chemical etching the substrate after the ion-beam etching.

14. The process of claim 13 wherein the step of ion-beam etching is continued until a recess of about 250-500 A is created in the substrate.

15. The process of claim 14 wherein the step of wet chemical etching is continued until a recess of about 1000-2000 A is created in the substrate.

16. A process for fabricating a Schottky barrier gate on a substrate, comprising the steps of:
   depositing a lift-off agent on the substrate;
   depositing a layer of photoresist on the lift-off agent;
   exposing the photoresist layer using a direct electron beam exposure, said electron beam exposure having a field which corresponds to a Schottky barrier gate region;
   developing the photoresist, leaving unexposed photoresist adherent to the lift-off agent only on those surface areas of the lift-off agent not exposed by the electron beam;
   depositing a metal transfer layer on the surface of the lift-off agent;

removing the unexposed photoresist to provide a hole through the metal transfer layer for defining a Schottky barrier gate region;

etching through the lift-off agent to provide a hole in the lift-off agent aligned with the hole in the metal transfer layer;

etching into the substrate surface through the hole in the metal transfer layer and the hole in the lift-off agent;

depositing a Schottky metal layer over the metal transfer layer and through the hole therein onto the substrate to create a Schottky barrier gate on the substrate; and dissolving the lift-off agent and lifting off the metal transfer layer to form the Schottky barrier gate.

17. The process of claim 16 wherein the step of depositing the metal transfer layer comprises:

depositing three separate metal layers, one above the other, over the lift-off agent, the layer adjacent the lift-off agent being a stress relief layer, the layer above and adjacent the stress relief layer being a stopping layer constructed of a high Z material for stopping ions in a reactive ion etch, and the layer above and adjacent the stopping layer being an anti-sputtering layer for preventing sputtering of said metal transfer layer during reactive ion sputtering.

18. The process of claim 17 wherein the step of depositing the three separate metal layers comprises:

depositing a layer of aluminum onto the lift-off agent as the stress relief layer;

depositing a layer of gold onto the aluminum layer as the stopping layer; and depositing a layer of titanium onto the gold layer as the anti-sputtering layer.

19. The process of claim 17 wherein the step of etching into the substrate surface comprises:

reactive ion etching through the lift-off agent down to the substrate.

20. The process of claim 19 wherein the step of etching into the substrate surface further comprises:

ion-beam etching the substrate after the reactive ion etching.

21. The process of claim 20 wherein the step of etching into the substrate surface further comprises:

wet chemical etching the substrate after the ion-beam etching.

22. The process of claim 21 wherein the step of ion-beam etching is continued until a recess of about 250–500 A is created in the substrate.

23. The process of claim 22 wherein the step of wet chemical etching is continued until a recess of about 1000–2000 A is created in the substrate.

24. The process of claim 16 wherein depositing said lift-off agent is performed by spin application.

25. The process of claim 16 wherein depositing said photoresist layer is performed by spin application.

26. The process of claim 16 wherein the step of etching into the substrate surface comprises:

reactive ion etching through the lift-off agent down to the substrate.

27. The process of claim 26 wherein the step of etching into the substrate surface further comprises:

ion-beam etching the substrate after the reactive ion etching.

28. The process of claim 27 wherein the step of etching into the substrate surface further comprises:

wet chemical etching the substrate after the ion-beam etching.

29. The process of claim 28 wherein the step of ion-beam etching is continued until a recess of about 250–500 A is created in the substrate.

30. The process of claim 29 wherein the step of wet chemical etching is continued until a recess of about 1000–2000 A is created in the substrate.

* * * * *